(12) United States Patent
Ai et al.

(10) Patent No.: US 10,511,265 B2
(45) Date of Patent: Dec. 17, 2019

(54) DOHERTY POWER AMPLIFIER CIRCUIT

(71) Applicant: DATANG MOBILE COMMUNICATIONS EQUIPMENT CO., LTD., Beijing (CN)

(72) Inventors: Baoqiang Ai, Beijing (CN); Yang Fang, Beijing (CN); Shimin Yang, Beijing (CN)

(73) Assignee: Datang Mobile Communications Equipment Co., Ltd., Beijing (CN)

( * ) Notice: Subject to any disclaimer, the term of this patent is extended or adjusted under 35 U.S.C. 154(b) by 93 days.

(21) Appl. No.: 15/767,135

(22) PCT Filed: Sep. 21, 2016

(86) PCT No.: PCT/CN2016/099605
§ 371 (c)(1),
(2) Date: Apr. 9, 2018

(87) PCT Pub. No.: WO2017/059769
PCT Pub. Date: Apr. 13, 2017

(65) Prior Publication Data
US 2019/0074799 A1 Mar. 7, 2019

(30) Foreign Application Priority Data
Oct. 8, 2015 (CN) .......................... 2015 1 0645404

(51) Int. Cl.
*H03F 1/02* (2006.01)
*H03F 1/42* (2006.01)
(Continued)

(52) U.S. Cl.
CPC ............. *H03F 1/0288* (2013.01); *H03F 1/42* (2013.01); *H03F 1/565* (2013.01); *H03F 3/21* (2013.01);
(Continued)

(58) Field of Classification Search
CPC .................................................... H03F 1/0288
See application file for complete search history.

(56) References Cited

U.S. PATENT DOCUMENTS

2002/0135425 A1 9/2002 Kim et al.
2011/0204974 A1 8/2011 Woo et al.
(Continued)

FOREIGN PATENT DOCUMENTS

CN 1858991 A 11/2006
CN 103023448 A 4/2013
(Continued)

*Primary Examiner* — Patricia T Nguyen
(74) *Attorney, Agent, or Firm* — Kilpatrick Townsend & Stockton, LLP (57) ABSTRACT

A Doherty power amplifier circuit comprises: a power divider, a carrier amplifier subcircuit, a combiner, and a peaking amplifier subcircuit, wherein a series resonance circuit is disposed between the carrier amplifier subcircuit and the combiner. In this way, reactance that would be introduced during an operating process of a conventional Doherty power amplifier circuit can be neutralized, such that a superior performance of the Doherty power amplifier circuit is ensured, and at the same time, a load-pull effect of the Doherty power amplifier circuit is improved to have a wider bandwidth, thereby realizing a communication device supporting operations in multiple frequency bands and multiple systems at the same time, and effectively lowering manufacturing and operation costs.

7 Claims, 5 Drawing Sheets

(51) Int. Cl.
*H03F 1/56* (2006.01)
*H03F 3/21* (2006.01)

(52) U.S. Cl.
CPC .. *H03F 2200/222* (2013.01); *H03F 2200/309* (2013.01); *H03F 2200/387* (2013.01); *H03F 2200/451* (2013.01)

(56) References Cited

U.S. PATENT DOCUMENTS

| | | | |
|---|---|---|---|
| 2012/0319782 A1* | 12/2012 | Nam | H03F 3/195 330/310 |
| 2013/0076446 A1 | 3/2013 | Wilson et al. | |
| 2013/0099866 A1 | 4/2013 | Conradi | |
| 2013/0222058 A1* | 8/2013 | Maniwa | H03G 1/00 330/144 |
| 2015/0123734 A1* | 5/2015 | Donati | H03F 1/0288 |
| 2015/0188504 A1* | 7/2015 | kesson | H03F 1/0288 330/286 |
| 2018/0175799 A1* | 6/2018 | Wu | H03F 1/0288 |
| 2019/0028062 A1* | 1/2019 | Shinjo | H03F 1/07 |

FOREIGN PATENT DOCUMENTS

| | | |
|---|---|---|
| CN | 103107778 A | 5/2013 |
| CN | 203800892 U | 8/2014 |
| CN | 104113286 A | 10/2014 |
| CN | 104218897 A | 12/2014 |
| JP | 5217182 B2 | 6/2013 |
| WO | 2012079542 A1 | 6/2012 |

\* cited by examiner

Frequency (1.200GHz to 1.800GHz)

Fig.5

DOHERTY POWER AMPLIFIER CIRCUIT

This application is a US National Stage of International Application No. PCT/CN2016/099605, filed on Sep. 21, 2016, designating the United States and claiming priority to Chinese Patent Application No. 201510645404.0, filed with the Chinese Patent Office on Oct. 8, 2015 and entitled "A Doherty power amplifier circuit", the content of which is hereby incorporated by reference in its entirety.

FIELD

The present invention relates to the technical field of circuits, and particularly to a Doherty power amplifier circuit.

BACKGROUND

With the constant development of communication technologies, 2G, 3G, and 4G communication systems are currently coexisting, and both device suppliers and network operators expect a communication device capable of operating in multiple frequency bands and in multiple operating modes to thereby lower a device production cost, and a network operating and maintenance cost. Furthermore the communication device is also required to operate efficiently in the multiple frequency bands and in the multiple operating modes from the perspectives of saving energy, reducing emission, and eco-friendly communication. There are inevitable bandwidth and efficient design challenges to a power amplifier which is such a component in the communication device that has the most seriously constricted operating bandwidth and consumes significant energy.

The existing high efficient power amplifiers are generally embodied in the Doherty circuit structure for their high efficiency, but the Doherty circuit structure thereof includes a λ/4 impedance conversion line which is such a narrowband component that results in a limited available bandwidth of the traditional Doherty structure. An inverted Doherty circuit structure is an efficient solution to a power amplifier for a wider bandwidth, and respective components in the power amplifier are required to match therewith, but not all the components may operate therewith. The existing gallium nitride, GaN, components, particularly components consuming high power, generally can not technically operate in the inverted Doherty circuit structure, so the GaN components still have to operate in the traditional Doherty circuit structure to be improved, and accordingly the Doherty circuit structure needs to be redesigned for an improved bandwidth thereof.

SUMMARY

Embodiments of the invention provide a Doherty power amplifier circuit so as to address the narrowband characteristic of the traditional Doherty radio-frequency power amplifier by improving effectively the broadband performance thereof while guaranteeing the high efficiency thereof.

Particular technical solutions according to the embodiments of the invention are as follows.

There is a Doherty power amplifier circuit including a power distributor 1, a carrier amplifier branch 2, a peak amplifier branch 4, and a combiner 3, where a series resonator circuit 5 is arranged between the carrier amplifier branch 2 and the combiner 3, and is configured to: appear inductive when an operating frequency of the Doherty power amplifier circuit is higher than a central frequency, appear capacitive when the operating frequency of the Doherty power amplifier circuit is lower than the central frequency, and have an impedance of 0 when the operating frequency of the Doherty power amplifier circuit is the central frequency.

In one embodiment, the carrier amplifier branch 2 includes a first input matching circuit 20, a carrier amplifier transistor 21, a first output matching circuit 22, and a first offset line 23, all of which are connected in series, where one end of the first input matching circuit 20 is connected with the power distributor 1, and one end of the first offset line 23 is connected with the series resonator circuit 5.

In one embodiment, the carrier amplifier transistor 21 is a LDMOS component or a GaN component, and a characteristic impedance of the first offset line 23 is 50 ohms.

In one embodiment, the combiner 3 includes a first λ/4 impendence conversion line 30, a second λ/4 impendence conversion line 31, and a first load 32, all of which are connected in series, where two ends of the first λ/4 impendence conversion line 30 are connected respectively with the series resonator circuit 5 and the peak amplifier branch 4, and λ represents a wavelength of an impendence conversion line.

In one embodiment, a characteristic impendence of the first λ/4 impendence conversion line 30 is 50 ohms, a characteristic impendence of the second λ/4 impendence conversion line 31 is $$\frac{50}{\sqrt{1+a}} \text{ ohms,}$$

and a resistance of the first load 32 is 50 ohms, where a maximum output capacity of the peak amplifier transistor divided by a maximum output capacity of the carrier amplifier transistor is α.

In one embodiment the peak amplifier branch 4 includes a second offset line 40, a second input matching circuit 41, a peak amplifier transistor 42, a second output matching circuit 43, a third λ/4 impendence conversion line 44, and a third offset line 45, all of which are connected in series, where one end of the second offset line 40 is connected with the power distributor 1, and one end of the third offset line 45 is connected with the combiner 3; and λ represents a wavelength of an impendence conversion line.

IN one embodiment the peak amplifier transistor 42 is an LDMOS component or a GaN component, a characteristic impendence of the third λ/4 impendence conversion line 44 is $$\frac{50}{\sqrt{a}} \text{ ohms,}$$

a characteristic impendence of the second offline line 40 is 50 ohms, and a characteristic impendence of the third offset line 45 is $$\frac{50}{a} \text{ ohms,}$$

where a maximum output capacity of the peak amplifier transistor divided by a maximum output capacity of the carrier amplifier transistor is α.

In the embodiments of the invention, the series resonator circuit is added to the traditional Doherty power amplifier circuit to thereby counteract a reactance introduced by the combiner in the traditional Doherty power amplifier circuit in operation, so as to improve a load pulling effect of the Doherty power amplifier circuit while operating efficiently, so that the load pulling effect is in wider bandwidth to enable a communication device to operate in multiple frequency bands and in multiple operating modes so as to lower production and operating costs.

DETAILED DESCRIPTION OF THE EMBODIMENTS

In order to make the objects, technical solutions, and advantages of the embodiments of the invention more apparent, the technical solutions according to the embodiments of the invention will be described below clearly and fully with reference to the drawings in the embodiments of the invention, and apparently the embodiments to be described below are only a part but not all of the embodiments of the invention.

In order to address the narrowband characteristic of the traditional radio-frequency Doherty power amplifier circuit, the Doherty circuit structure is redesigned in the invention to improve effectively the broadband performance of the Doherty power amplifier circuit so that the power amplifier circuit can operate efficiently in multiple frequency bands.

Preferable embodiments of the invention will be described below in details with reference to the drawings.

Figure 1:
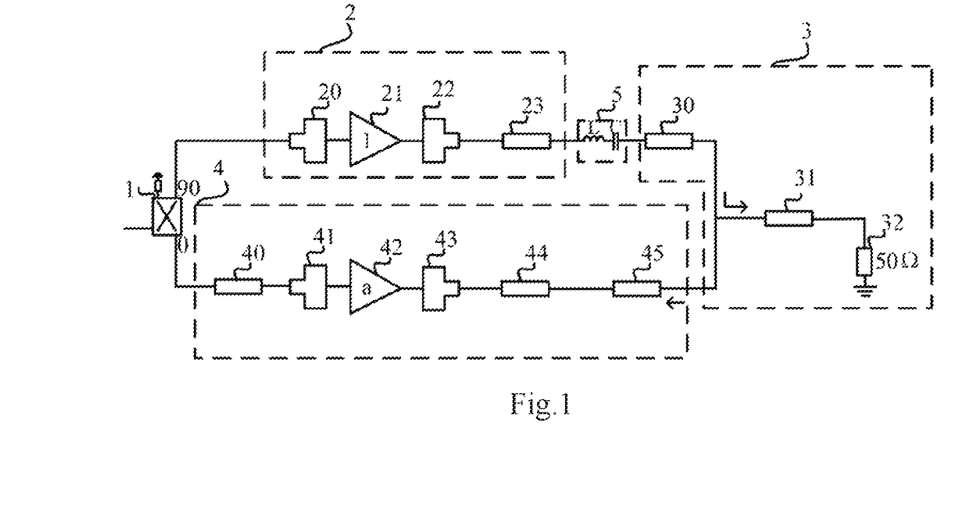
FIG. 1 is a schematic diagram of the principle of a radio-frequency power amplifier circuit according to an embodiment of the invention.

Referring to FIG. 1, a redesigned Doherty power amplifier circuit according to an embodiment of the invention includes a power distributor 1, a carrier amplifier branch 2, a peak amplifier branch 4, and a combiner 3 in that order, which are particularly connected in such a way that two ends of the power distributor 1 are connected respectively with one end of the carrier amplifier branch 2 and one end of the peak amplifier branch 4, and the other end of the carrier amplifier branch 2 and the other end of the peak amplifier branch 4 are connected respectively with the combiner 3. A series resonator circuit 5 is arranged between the carrier amplifier branch 2 and the combiner 3. The series resonator circuit 5 is configured to: appear inductive when an operating frequency of the Doherty power amplifier circuit above is higher than a central frequency, appear capacitive when the operating frequency of the Doherty power amplifier circuit above is lower than the central frequency, and have an impedance of 0 when the operating frequency of the Doherty power amplifier circuit above is the central frequency.

As illustrated in FIG. 1, the carrier amplifier branch 2 includes a first input matching circuit 20, a carrier amplifier transistor 21, a first output matching circuit 22, and a first offset line 23, all of which are connected in series. One end of the first input matching circuit 20 is connected with the power distributor 1, and one end of the first offset line 23 is connected with the series resonator circuit 5. In one embodiment the carrier amplifier transistor 21 is a Laterally Diffused Metal Oxide Semiconductor, LDMOS, component or a gallium nitride, GaN, component, and a characteristic impedance of the first offset line 23 is 50 ohms.

As illustrated in FIG. 1, the combiner 3 includes a first $\lambda/4$ impendence conversion line 30, a second $\lambda/4$ impendence conversion line 31, and a first load 32, all of which are connected in series. Two ends of the first $\lambda/4$ impendence conversion line 30 are connected respectively with the series resonator circuit 5 and the peak amplifier branch 4.

As illustrated in FIG. 1, the peak amplifier branch 4 includes a second offset line 40, a second input matching circuit 41, a peak amplifier transistor 42, a second output matching circuit 43, a third $\lambda/4$ impendence conversion line 44, and a third offset line 45, all of which are connected in series. One end of the second offset line 40 is connected with the power distributor 1, and one end of the third offset line 45 is connected with the combiner 3.

Figure 2:
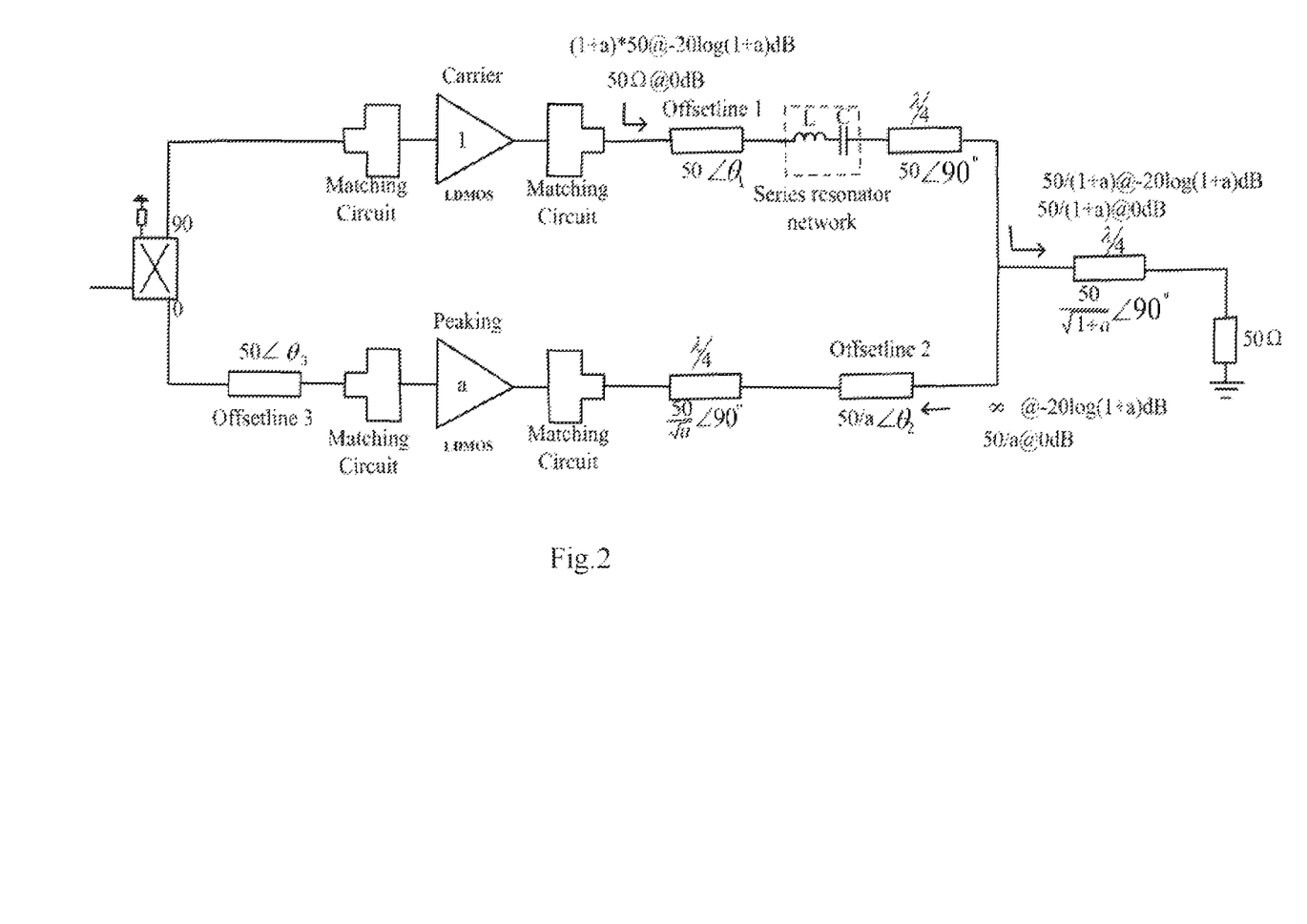
FIG. 2 is a schematic diagram of an example of the radio-frequency power amplifier circuit according to an embodiment of the invention.

As illustrated in FIG. 2, in an embodiment, In one embodiment, the carrier amplifier transistor 21 is an LDMOS component or a GaN component, and a characteristic impendence of the first offset line 23 is 50 ohms In one embodiment a characteristic impendence of the first $\lambda/4$ impendence conversion line 30 is 50 ohms, a characteristic impendence of the second $\lambda/4$ impendence conversion line 31 is ohms and a resistance of the first load 32 is 50 ohms. In one embodiment the peak amplifier transistor 42 is an LDMOS component or a GaN component, a characteristic impendence of the third $\lambda/4$ impendence conversion line 44 is and a characteristic impendence of the third offset line 45 is where $\lambda$ represents a wavelength of an impendence conversion line, and the same will apply hereinafter, so a repeated description thereof will be omitted.

As illustrated in FIG. 1 and FIG. 2, the second offset line 40 is arranged to align the carrier amplifier branch 2 in phase with the peak amplifier branch 4, and In one embodiment a characteristic impendence of the second offset line 40 is 50 ohms.

As illustrated in FIG. 1 and FIG. 2, in an embodiment of the invention combined with the design scheme of the traditional Doherty power amplifier circuit, the ratio of the maximum output capacity of the peak amplifier transistor 42 to the maximum output capacity of the carrier amplifier transistor 21 is an expected value a, that is, the maximum output capacity of the peak amplifier transistor divided by the maximum output capacity of the carrier amplifier transistor is a. In the traditional Doherty power amplifier circuit, the first input matching circuit 20 and the first output matching circuit 22 can match the impendence of the carrier amplifier transistor 21 with 50 ohms, and the second input matching circuit 41 and the second output matching circuit 43 can match the impendence of the peak amplifier transistor 42 with 50 ohms, in order for corresponding performance. The first offset line 23 with the characteristic impendence of 50 ohms in the carrier amplifier branch 2, and the first $\lambda/4$ impendence conversion line 30 with the characteristic impendence of 50 ohms in the combiner 3 operate to modulate the load of the carrier amplifier transistor 21 from 50 ohms to 50*a ohms given back-off power of $-20\log(1+a)$ dB in order for high efficiency. The third λ/4 impendence conversion line 44 with the characteristic impendence of $$\frac{50}{\sqrt{a}} \text{ ohms}$$

in the peak amplifier branch 4 operates to convert the 50-ohm load impendence of the peak amplifier transistor 42 to $$\frac{50}{a} \text{ ohms}$$

to thereby satisfy the power ratio a of the peak amplifier transistor 42 to the carrier amplifier transistor 21. The third offset line 45 with the characteristic impendence of $$\frac{50}{a} \text{ ohms}$$

operates for an open performance of the peak amplifier branch given back-off power of −20 log(1+a) dB in order for reduced power leakage and high efficiency. The narrowband characteristic of the Doherty power amplifier circuit in the traditional design paradigm arises from the narrow characteristic of the first λ/4 impendence conversion line 30, the third λ/4 impendence conversion line 44, the first offset line 23, and the third offset line 45.

In an embodiment of the invention, the series resonator circuit 5 is added to the carrier amplifier branch 2 to improve a bandwidth of the amplifier circuit, because the series resonator circuit 5 is characterized in that: it has an impendence of 0 when the operating frequency of the Doherty power amplifier circuit is the central frequency, appears inductive when the operating frequency of the Doherty power amplifier circuit is higher than the central frequency, and appears capacitive when the operating frequency of the Doherty power amplifier circuit is lower than the central frequency. The central frequency is the center of the entire bandwidth, and for example, the highest operating frequency is F1, and the lowest operating frequency is F2, given a bandwidth, so there is a central frequency of (F1+F2)/2.

Since the combiner in the traditional Doherty power amplifier circuit is characterized in that it appears capacitive when the operating frequency is higher than the central frequency, and appears inductive when the operating frequency is lower than the central frequency, apparently its characteristic is exactly opposite to that of the series resonator circuit 5, so the series resonator circuit 5 can counteract a reactance part of the Doherty power amplifier circuit in operation so that the input impendence of the combiner appears substantially only having the real part in a certain bandwidth to thereby extend effectively a load pulling bandwidth of the traditional Doherty power amplifier circuit.

Figure 3:
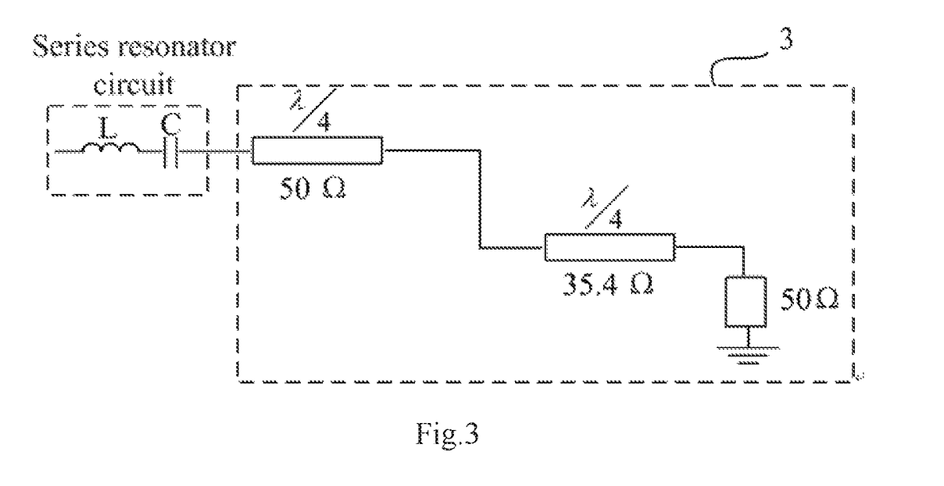
FIG. 3 is a schematic diagram of an implementation of a combiner according to an embodiment of the invention.

As illustrated in FIG. 3, a load pulling effect in the traditional Doherty power amplifier circuit is achieved by the first λ/4 impendence conversion line 30 of 50 ohms in the combiner 3 given back-off power of −20 log(1+a) dB; but the desirable load pulling effect can only be achieved at the central frequency, and the load pulling effect becomes poorer at a frequency further from the central frequency, due to the narrowband characteristic thereof.

Figure 4:
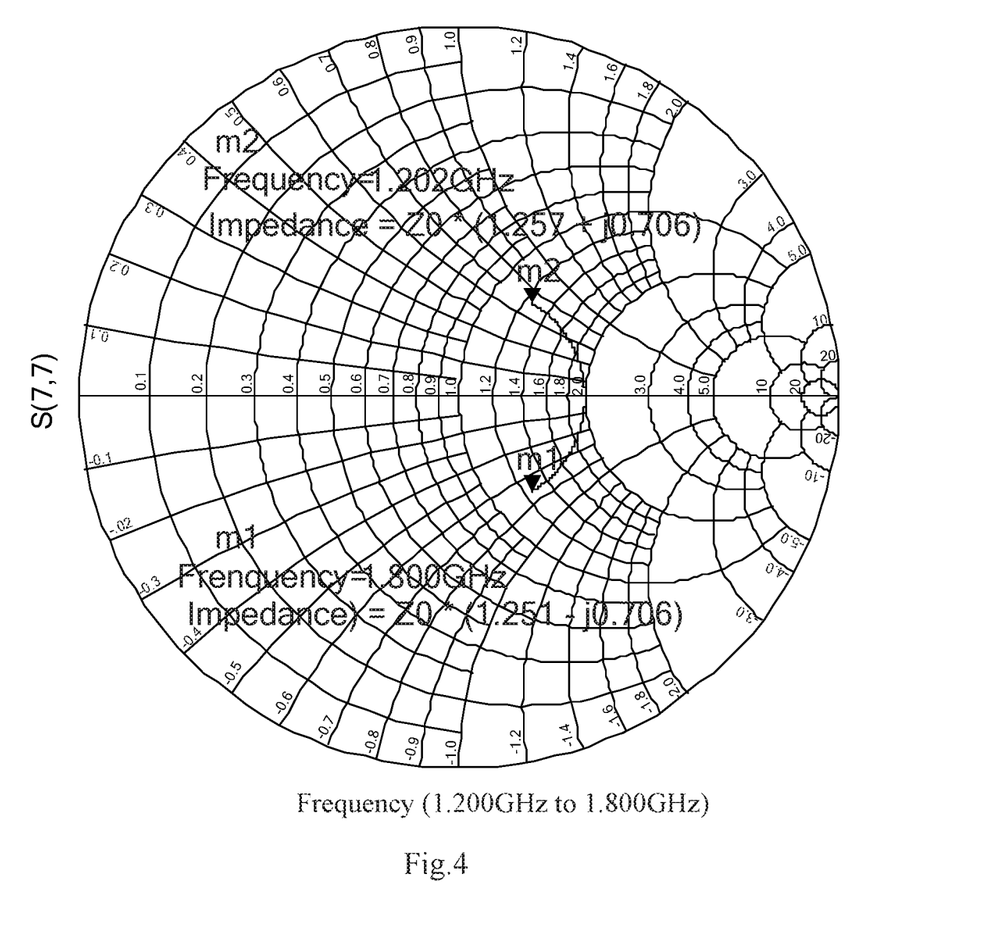
FIG. 4 is a schematic diagram of a load pulling effect in the traditional Doherty power amplifier circuit at 1.2 GHz to 1.8 GHz in the prior art.

As illustrated in FIG. 4, taking the traditional Doherty power amplifier circuit including the carrier amplifier transistor 21 and the peak amplifier transistor 42, both of which are matched to 50 ohms as an example (suppose a symmetric structure, i.e., α=1, is adopted, and a load pulling effect in the frequency range of 1.2 GHz to 1.8 GHz is simulated), FIG. 4 shows clearly the narrowband characteristic of the traditional Doherty power amplifier circuit. Particularly in the traditional Doherty power amplifier circuit, the first λ/4 impendence conversion line 30 of 50 ohms with a narrowband characteristic may not achieve load pulling effectively in the bandwidth; and as can be apparent from FIG. 4, the frequencies other than the central frequency are distributed on two sides of the real axis of the Smith chart (represented as the curve m1m2), and appear capacitive and inductive respectively, while an ideal load pulling effect is achieved until the real axis throughout the bandwidth, that is, the impedance of the combiner appears only having the real part, but not having the imaginary part.

Figure 5:
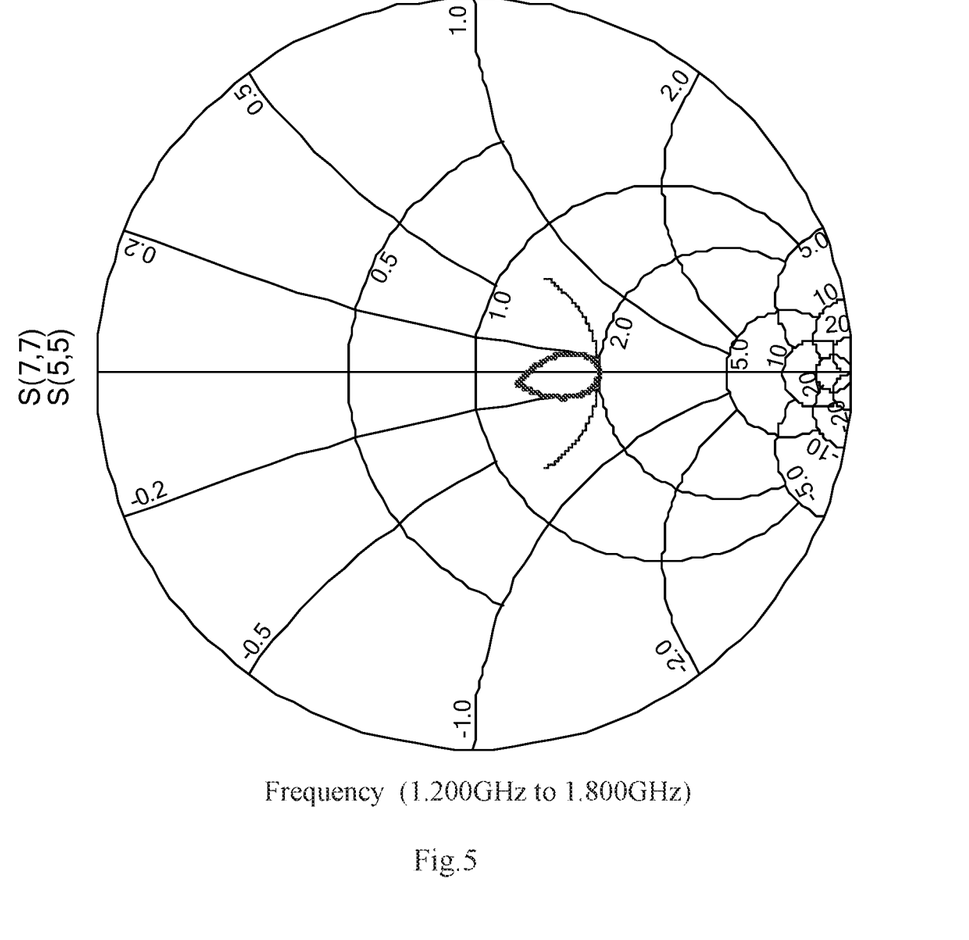
FIG. 5 is a schematic diagram of a load pulling effect in the Doherty power amplifier circuit at 1.2 GHz to 1.8 GHz according to an embodiment of the invention.

As illustrated in FIG. 5, taking the traditional Doherty power amplifier circuit including the carrier amplifier transistor 21 and the peak amplifier transistor 42, both of which are matched to 50 ohms as an example (suppose in a symmetric structure, i.e., a=1, is adopted, and a load pulling effect in the frequency range of 1.2 GHz to 1.8 GHz is simulated), particularly after the series resonator circuit 5 is added, a load pulling effect in the frequency range of 1.2 GHz to 1.8 GHz is changed from the curve X to the curve Y, and apparently the load pulling effect is in wider bandwidth, which approximates an ideal load pulling effect, after the series resonator circuit 5 is added, because the series resonator circuit 5 appears inductive when the operating frequency thereof is higher than the central frequency, appears capacitive when the operating frequency thereof is lower than the central frequency, and has an impendence of 0 when the operating frequency thereof is the central frequency. The series resonator circuit 5 is connected in series with the first λ/4 impendence conversion line 30 of 50 ohms to thereby counteract a reactance part introduced by the first λ/4 impendence conversion line so as to improve effectively the bandwidth of the Doherty power amplifier circuit.

The newly designed Doherty power amplifier circuit above can also be applicable to a GaN component, and can be applicable to another circuit component adapted thereto, although a repeated description thereof will be omitted here.

In summary, in embodiments of the invention, the series resonator circuit is added to the traditional Doherty power amplifier circuit to thereby counteract a reactance introduced by the combiner in the traditional Doherty power amplifier circuit in operation, so as to improve the load pulling effect of the Doherty power amplifier circuit while operating efficiently, so that the load pulling effect is in wider bandwidth to enable a communication device to operate in multiple frequency bands and in multiple operating modes so as to lower the production and operating costs.

Embodiments of the invention can be embodied as a method, a system or a computer program product. Therefore the invention can be embodied in the form of an all-hardware embodiment an all-software embodiment or an embodiment of software and hardware in combination. Furthermore the invention can be embodied in the form of a computer program product embodied in one or more computer useable storage mediums (including but not limited to a disk memory, a CD-ROM, an optical memory, etc.) in which computer useable program codes are contained.

The invention has been described in a flow chart and/or a block diagram of the method, the device (system) and the computer program product according to the embodiments of the invention. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

The invention claimed is:

1. A Doherty power amplifier circuit, comprising:
a power distributor, a carrier amplifier branch, a peak amplifier branch and a combiner, wherein:
a series resonator circuit is arranged between the carrier amplifier branch and the combiner, and configured to: appear inductive when an operating frequency of the Doherty power amplifier circuit is higher than a central frequency, appear capacitive when the operating frequency of the Doherty power amplifier circuit is lower than the central frequency, and have an impedance of 0 when the operating frequency of the Doherty power amplifier circuit is the central frequency.

2. The Doherty power amplifier circuit according to claim 1, wherein the carrier amplifier branch comprises a first input matching circuit, a carrier amplifier transistor, a first output matching circuit, and a first offset line, all of which are connected in series, wherein one end of the first input matching circuit is connected with the power distributor, and one end of the first offset line is connected with the series resonator circuit.

3. The Doherty power amplifier circuit according to claim 2, wherein the carrier amplifier transistor is a Laterally Diffused Metal Oxide Semiconductor, LDMOS, component or a gallium nitride, GaN, component, and a characteristic impedance of the first offset line is 50 ohms.

4. The Doherty power amplifier circuit according to claim 1, wherein the combiner comprises a first λ/4 impendence conversion line, a second λ/4 impendence conversion line, and a first load, all of which are connected in series, wherein two ends of the first λ/4 impendence conversion line are connected respectively with the series resonator circuit and the peak amplifier branch, and λ represents a wavelength of an impendence conversion line.

5. The Doherty power amplifier circuit according to claim 4, wherein a characteristic impendence of the first λ/4 impendence conversion line is 50 ohms, a characteristic impendence of the second λ/4 impendence conversion line is $$\frac{50}{\sqrt{1+a}} \text{ ohms,}$$

and a resistance of the first load is 50 ohms, wherein a maximum output capacity of the peak amplifier transistor divided by a maximum output capacity of the carrier amplifier transistor is $\alpha$.

6. The Doherty power amplifier circuit according to claim 1, wherein the peak amplifier branch comprises a second offset line, a second input matching circuit, a peak amplifier transistor, a second output matching circuit, a third λ/4 impendence conversion line, and a third offset line, all of which are connected in series, wherein one end of the second offset line is connected with the power distributor and one end of the third offset line is connected with the combiner; and λ represents a wavelength of an impendence conversion line.

7. The Doherty power amplifier circuit according to claim 6, wherein the peak amplifier transistor is an LDMOS component or a GaN component, a characteristic impendence of the third λ/4 impendence conversion line is $$\frac{50}{\sqrt{a}} \text{ ohms,}$$

a characteristic impendence of the second offset line is 50 ohms, and a characteristic impendence of the third offset line is $$\frac{50}{a} \text{ ohms,}$$

wherein a maximum output capacity of the peak amplifier transistor divided by a maximum output capacity of the carrier amplifier transistor is $\alpha$.

* * * * *